United States Patent
Yamazaki et al.

(10) Patent No.: US 6,855,418 B2
(45) Date of Patent: Feb. 15, 2005

(54) TAPE FOR FORMING RESIN TIE BAR, RESIN TIE BAR, LEAD FRAME EQUIPPED WITH RESIN TIE BAR, RESIN-MOLDED SEMICONDUCTOR DEVICE, AND METHOD FOR PRODUCING SAME

(75) Inventors: Osamu Yamazaki, Saitama (JP); Hideo Senoo, Kawaguchi (JP); Kazuyoshi Ebe, Shiraoka-machi (JP)

(73) Assignee: LINTEC Corporation, Tokyo (JP)

( * ) Notice: Subject to any disclaimer, the term of this patent is extended or adjusted under 35 U.S.C. 154(b) by 0 days.

(21) Appl. No.: 10/147,350

(22) Filed: May 17, 2002

(65) Prior Publication Data

US 2002/0192464 A1 Dec. 19, 2002

(30) Foreign Application Priority Data

May 18, 2001 (JP) ......................................... 2001-149035

(51) Int. Cl.⁷ ........................... H01L 23/50; H01L 23/31
(52) U.S. Cl. ........................... 428/355 EP; 428/355 AC; 428/346; 428/349; 428/473.5; 428/480; 257/729; 257/730; 257/783; 257/692
(58) Field of Search ................... 428/355 EP, 355 AC, 428/346, 349, 473.5, 480; 270/729, 730, 783, 692

(56) References Cited

U.S. PATENT DOCUMENTS 4,687,693 A * 8/1987 Sheyon et al. .............. 428/148

| | | | |
|---|---|---|---|
| 5,258,331 A | 11/1993 | Masumoto et al. | |
| 6,239,487 B1 * | 5/2001 | Park et al. ................... | 257/712 |
| 2002/0056904 A1 * | 5/2002 | Miyaki et al. .............. | 257/692 |
| 2002/0056905 A1 * | 5/2002 | Miyaki et al. .............. | 257/692 |

FOREIGN PATENT DOCUMENTS

| | | |
|---|---|---|
| EP | 0 683 518 A2 | 12/1995 |
| EP | 1 094 512 A1 | 12/1999 |
| JP | A-H02-122660 | 10/1990 |
| JP | A-H04-091464 | 3/1992 |
| JP | A-H04-133459 | 5/1992 |
| JP | 06-037126 | * 2/1994 |
| JP | 06-310652 | * 11/1994 |
| JP | 07-161916 | * 6/1995 |

* cited by examiner

*Primary Examiner*—Daniel Zirker
(74) *Attorney, Agent, or Firm*—Posz & Bethards, PLC (57) ABSTRACT

A resin tie bar 1A is formed from a base material 10, 11 of a heat-resistant resin whose melting point is higher than the temperature during resin molding and an insulative adhesive layer 12 on the base material 10, 11 and formed from an insulative adhesive agent that may or may not be removable prior to resin molding depending upon its composition. The resin tie bar 1A is applied to the surface of the leads 22 of a lead frame, and resin molding is then performed, during which the resin tie bar 1A is pressed by a heated mold 3, which softens the insulative adhesive agent of the resin tie bar 1A and pushes it into the gaps 23 between the leads 22 of the lead frame. Thus the resin tie bar 1A can be easily formed into a shape that is favorable for the leads 22 of the lead frame.

9 Claims, 5 Drawing Sheets

TAPE FOR FORMING RESIN TIE BAR, RESIN TIE BAR, LEAD FRAME EQUIPPED WITH RESIN TIE BAR, RESIN-MOLDED SEMICONDUCTOR DEVICE, AND METHOD FOR PRODUCING SAME

BACKGROUND OF THE INVENTION

1. Field of the Invention

The present invention relates to a tie bar made of resin, which is used to prevent softened molding resin from leaking out between leads of a lead frame during resin molding in producing a resin-molded semiconductor device; a tape for forming such a resin tie bar; a lead frame having a resin tie bar; a resin-molded semiconductor device that makes use of a resin tie bar; and a method for producing this device.

2. Description of the Related Art

When a resin-molded semiconductor device is produced, a lead frame on which a semiconductor chip has been mounted and which has been wire bonded is molded with a resin. In this resin molding step, the lead frame is clamped between upper and lower molds, and the cavity of the mold is filled with a heated and softened molding resin.

When this resin molding is performed, a tie bar is provided between the leads of the lead frame in order to prevent the molding resin, which is fluid, from leaking out from between the leads of the lead frame. This tie bar is usually formed integrally with the leads when the lead frame is etched, and is therefore composed of the same material as the lead frame, namely, an electroconductive metal.

Because the leads of a semiconductor device need to be insulated from one another, the tie bar is cut away after resin molding. However, as the pin count has risen in recent years, such as in a QFP (Quad Flat Package), the tendency has been for the lead pitch to narrow, and it is difficult to cut tie bars precisely between leads of such narrow pitch.

The use of tie bars made of resin instead of metal has been proposed in an effort to obviate the need for cutting away the tie bars (such as in Japanese Laid-Open Patent Applications H6-37126, H6-310652, and H7-161916, and Japanese Patent 3,047,716), but the accurate positioning of the tie bars was difficult in the formation of the tie bars on the lead frame, or the tie bars were not formed in the proper shape, leading to the risk of molding resin leakage from between the leads.

SUMMARY OF THE INVENTION

The present invention was conceived in light of this situation, and it is an object thereof to provide a resin tie bar that can be easily and accurately positioned with respect to a lead frame, or a resin tie bar that can be easily formed in the proper shape for leads; a tape for forming such a resin tie bar; a lead frame produced using this resin; a resin-molded semiconductor device; and a method for producing a resin-molded semiconductor device.

To achieve the stated object, the tape for forming a resin tie bar pertaining to the present invention comprises a tape base material and an insulative adhesive layer of an insulative adhesive agent and formed on the tape base material, wherein the insulative adhesive agent exhibits stepped adhesion. The first resin tie bar pertaining to the present invention is composed of an insulative adhesive agent that exhibits stepped adhesion.

With the above-mentioned tape for forming a resin tie bar, the insulative adhesive layer is applied through its adhesive strength to the leads of the lead frame, after which the tape base material is peeled away, and resin molding is performed.

The insulative adhesive agent that exhibits stepped adhesion may be one having a stage at which tack (peelable adhesion) is exhibited, and a stage at which adhesion (permanent adhesion) is exhibited upon softening or melting (this is known as a tacky adhesive agent), or it may be one that does not exhibit either tack or adhesion under normal circumstances, but exhibits stepped tack/adhesion when softened or melted by a trigger such as heat or pressure. The benefit of the insulative adhesive agent of the insulative adhesive layer exhibiting stepped adhesion is that the resin tie bar (insulative adhesive layer) can be tacked to the lead frame prior to resin molding, and the resin tie bar can be accurately positioned with respect to the lead frame. Also, if the resin tie bar should be applied in the wrong position, it can be reapplied if the adhesive strength of the insulative adhesive agent in this tacking stage has been adjusted.

The above-mentioned resin tie bar (insulative adhesive layer) is pressed by a heated mold in the resin molding step, which softens it and pushes it in between the leads of the lead frame. This resin tie bar that has been embedded between the leads of the lead frame prevents the molding resin from leaking out between the leads, but does not need to be cut away because it is insulative.

The second resin tie bar pertaining to the present invention comprises a base material made from a heat-resistant resin having a melting point higher than a temperature during resin molding, and an insulative adhesive layer composed of an insulative adhesive agent and formed on the tape base material.

With the second resin tie bar, after the insulative adhesive layer has been applied to the lead frame through its adhesive strength, it can be subjected to resin molding without peeling off the base material, so there is no need for a base material peeling step, and this simplifies the semiconductor device producing process. Because this base material is made from a heat-resistant resin having a melting point higher than the temperature during resin molding, it will not undergo thermal deformation when subjected to resin molding, and therefore any leakage of molding resin that would otherwise be caused by thermal deformation of the base material is prevented.

In the above invention, the insulative adhesive agent preferably exhibits stepped adhesion. If the insulative adhesive agent does exhibit stepped adhesion, then the resin tie bar can be temporarily tacked to the lead frame prior to resin molding, allowing the resin tie bar to be accurately positioned with respect to the lead frame. Adjusting the adhesive strength of the insulative adhesive agent at this tacking stage makes it possible to re-tack the resin tie bar if it should happen to be misaligned.

The present invention also provides a lead frame equipped with a resin tie bar, wherein the above-mentioned resin tie bar is applied to a surface of leads of the lead frame.

The present invention also provides a first resin-molded semiconductor device, wherein the insulative adhesive agent of the above-mentioned resin tie bar is embedded between leads of a lead frame, and a second resin-molded semiconductor device, wherein the insulative adhesive agent of the above-mentioned resin tie bar is embedded between leads of a lead frame, and the base material of the resin tie bar is interposed between the molding resin and the leads of the lead frame.

The method of the present invention for producing a resin-molded semiconductor device comprises the steps of applying the above-mentioned resin tie bar to a surface of leads of a lead frame, and, when resin molding is performed, pressing the resin tie bar with a heated mold to soften the insulative adhesive agent of the resin tie bar and push it in between the leads of the lead frame. As long as there is no leakage of molding resin, the step in which the insulative adhesive agent of the resin tie bar is pushed in between the leads may be carried out simultaneously with the injection of the molding resin into the mold, or the molding resin may be injected into the mold after the insulative adhesive agent of the resin tie bar has been pushed in between the leads.

The third resin-molded semiconductor device of the present invention is produced by the above-mentioned method.

DESCRIPTION OF THE PREFERRED EMBODIMENTS

Embodiment of the present invention will now be described.

First Embodiment

Figure 1:
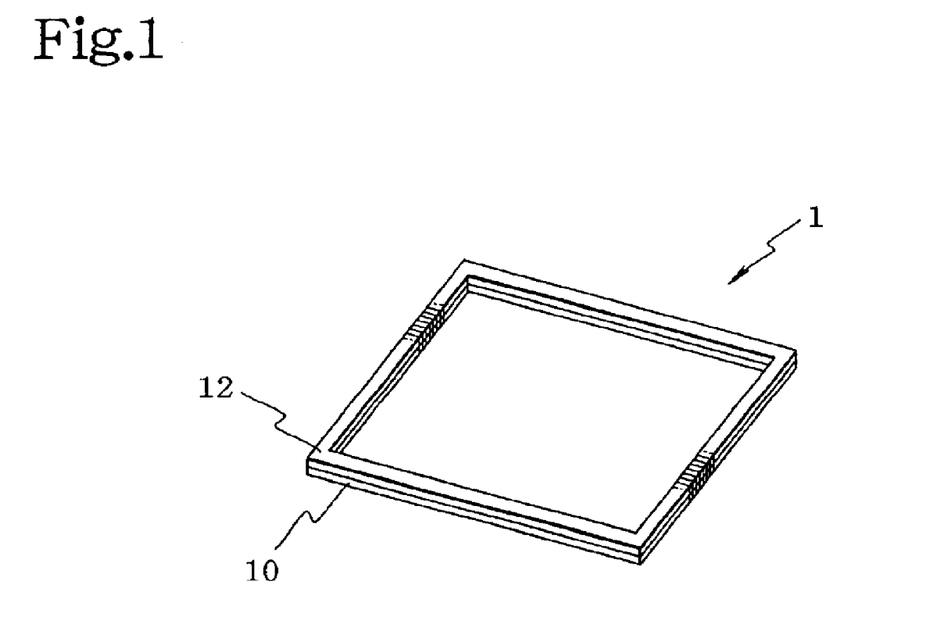
FIG. 1 is a perspective view of the resin tie bar forming tape pertaining to an embodiment of the present invention.
Figure 2:
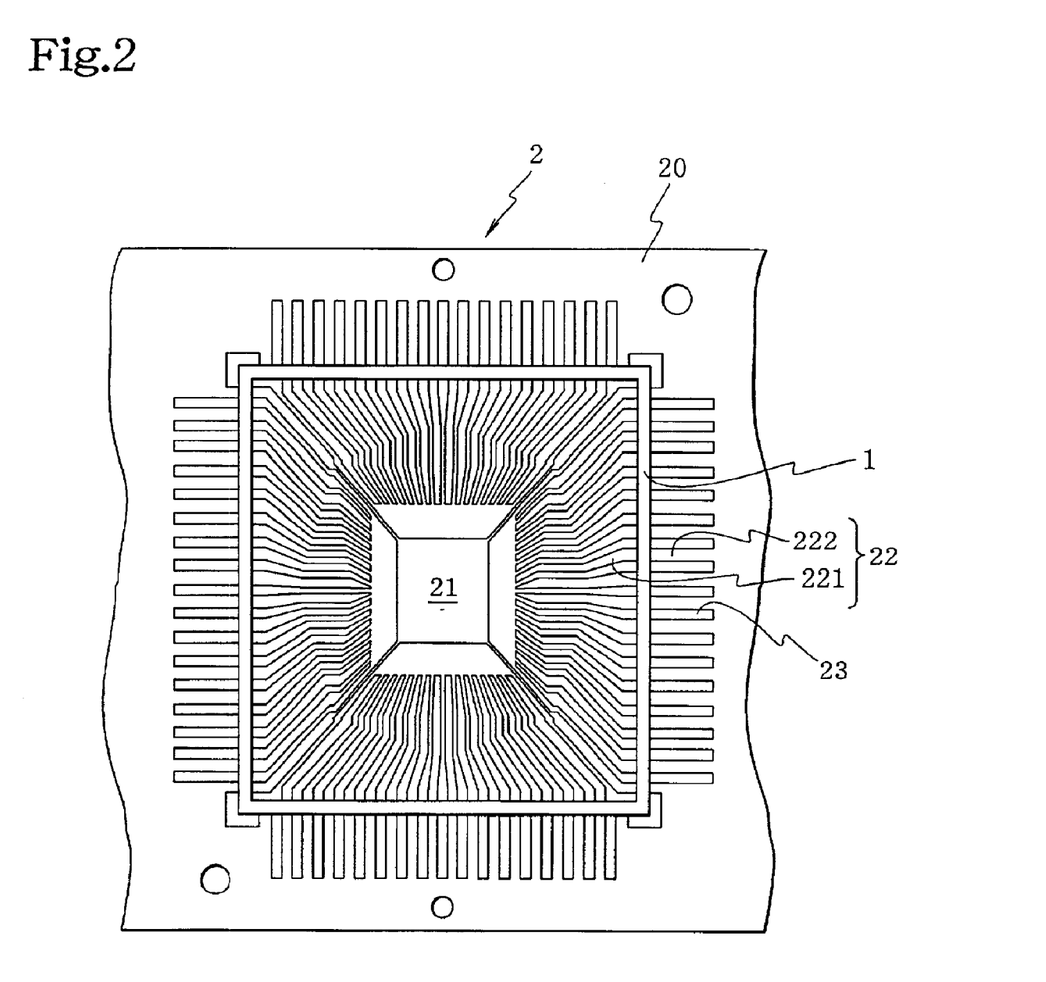
FIG. 2 is a plan view of a lead frame equipped with a resin tie bar to which the resin tie bar forming tape pertaining to the same embodiment has been applied.
Figure 3:
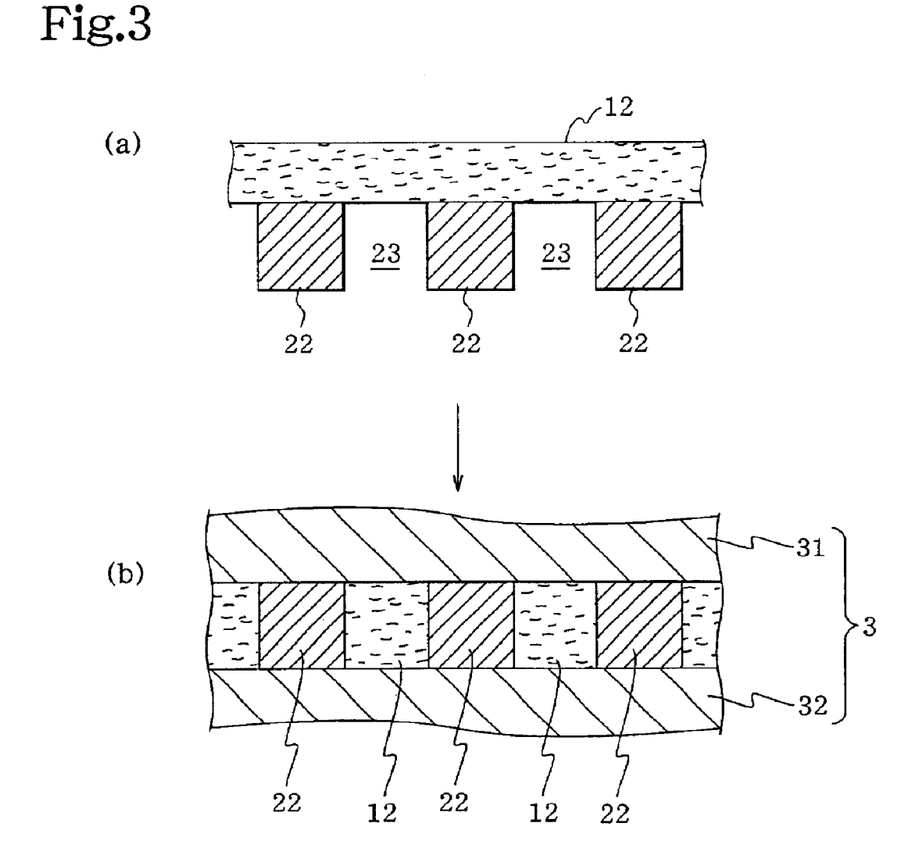
FIGS. 3(a) and 3(b) are schematic sectional views illustrating how the resin tie bar (insulative adhesive agent) pertaining to the same embodiment is embedded between the leads of a lead frame.

FIG. 1 is a perspective view of the resin tie bar forming tape pertaining to an embodiment of the present invention, FIG. 2 is a plan view of a lead frame equipped with a resin tie bar to which the resin tie bar forming tape pertaining to this embodiment has been applied, and FIG. 3 is a schematic sectional view how the resin tie bar (insulative adhesive agent) pertaining to this embodiment is embedded between the leads of a lead frame.

Resin Tie Bar Forming Tape 1

As shown in FIG. 1, the resin tie bar forming tape 1 pertaining to the first embodiment of the present invention comprises a tape base material 10 and an insulative adhesive layer 12 formed over the tape base material 10. This resin tie bar forming tape 1 is square in plan view shape so as to correspond to the shape of a lead frame 20 (discussed below).

Insulative Adhesive Layer 12

The thickness of the insulative adhesive layer 12 will vary with the thickness of the lead frame 20 (lead portion) in question, and with the gap between the leads 22, but is usually about 10 to 300 $\mu$m.

The insulative adhesive layer 12 is composed of an insulative adhesive agent that exhibits stepped adhesion. Adhesive agents that exhibit stepped adhesion include those having a stage at which tack (peelable adhesion) is exhibited, and a stage at which adhesion (permanent adhesion) is exhibited upon softening or melting (this is known as a tacky adhesive agent), those that do not exhibit either tack or adhesion under normal circumstances, but exhibit stepped tack/adhesion when softened or melted by a trigger such as heat or pressure.

An example of the former type of adhesive agent (tacky adhesive agent) is (a) a composition containing a thermosetting resin and a tacky component, and examples of the latter type include (b) polyimide-based resins and (c) epoxy-based resins. These resins and resin compositions can be used singly, or materials in which these resins and resin compositions serve as a matrix can also be used.

a. Composition Containing Thermosetting Resin and Tacky Component

In general, with a composition containing a thermosetting resin and a tacky component, the thermosetting resin exhibits adhesion while the tacky component exhibits tack. Examples of the thermosetting resin in this composition include an epoxy resin, phenol resin, urea resin, melamine resin, unsaturated polyester resin, resorcinol resin, furan resin, polyurethane resin, and silicone resin, of which an epoxy resin is preferred. Meanwhile, examples of the tacky component include acrylic-based pressure-sensitive adhesives, rubber-based pressure-sensitive adhesives, polyester-based pressure-sensitive adhesives, and polyolefins, polyvinyl chlorides, polystyrenes, thermoplastic polyamides, polyesters, and other such thermoplastic resins. These may contain a photopolymerizable compound. A (meth)acrylic ester copolymer is preferable as this tacky component.

It is particularly favorable for the composition containing a thermosetting resin and a tacky component to be a composition that contains a (meth)acrylic ester copolymer with a weight average molecular weight of at least 30,000, an epoxy resin with a weight average molecular weight of 100 to 10,000, a photopolymerizable low-molecular weight compound, and a thermal activation latent epoxy resin curing agent (hereinafter sometimes referred to as "composition A").

Examples of (meth)acrylic ester copolymers with a weight average molecular weight of at least 30,000 include copolymers obtained by the copolymerization of monomers such as (meth)acrylic acid, alkyl (meth)acrylate derived from (meth)acrylic acid and a $C_1$ to $C_{14}$ alcohol, hydroxyethyl (meth)acrylate, glycidyl (meth)acrylate. Of these, it is preferable to use a copolymer of at least one type of alkyl (meth)acrylate and (meth)acrylic acid and/or glycidyl (meth)acrylate.

Specific examples of alkyl (meth)acrylate derived from (meth)acrylic acid and a $C_1$ to $C_{14}$ alcohol include methyl (meth)acrylate, ethyl (meth)acrylate, butyl (meth)acrylate and the like.

When a copolymer derived from (meth)acrylic acid and/or glycidyl (meth)acrylate is used as the (meth)acrylic ester copolymer, the proportion in which units derived from glycidyl (meth)acrylate are contained in this copolymer is usually set to between 0 and 80 mol %, and preferably 5 and 50 mol %, and the proportion in which units derived from (meth)acrylic acid are contained is usually set to between 0 and 40 mol %, and preferably 5 and 20 mol %. In this case, it is preferable to use methyl (meth)acrylate, ethyl (meth)acrylate, and butyl (meth)acrylate, or another such alkyl (meth)acrylate as a monomer component other than the (meth)acrylic acid and glycidyl (meth)acrylate that form the (meth)acrylic ester copolymer.

Examples of epoxy resins with a weight average molecular weight of 100 to 10,000 include glycidyl ethers of phenols such as bisphenol A, bisphenol F, resorcinol, phenyl novolac, cresol novolac and the like; glycidyl ethers of alcohols such as butanediol, polyethylene glycol, polypropylene glycol and the like; glycidyl ethers of carboxylic acids such as phthalic acid, isophthalic acid, tetrahydrophthalic acid and the like; aniline isocyanurate and other glycidyl- or alkylglycidyl-type epoxy resins in which an active hydrogen bonded to a nitrogen atom has been substituted with a glycidyl group; vinyl cyclohexene diepoxide, 3,4-epoxycyclohexylmethyl-3,4-dicyclohexanecarboxylate, 2-(3,4-epoxy)cyclohexyl-5,5-spiro(3,4-epoxy)cyclohexane-m-dioxane, and other so-called alicyclic epoxides in which epoxy groups have been introduced by oxidizing carbon-carbon double bonds in the molecule, for instance.

The epoxy equivalent of the above-mentioned epoxy resins is preferably 50 to 5000 g/eq. These epoxy resins may be used singly or in combinations of different types. Of these epoxy resins, it is preferable to use a bisphenol-based glycidyl-type epoxy resin, an o-cresol novolac-type epoxy resin, or a phenyl novolac-type epoxy resin.

The above-mentioned epoxy resins are usually used in an amount of 5 to 2000 weight parts, and preferably 100 to 1000 weight parts, per 100 weight parts of the (meth)acrylic ester copolymer.

A photopolymerizable low-molecular weight compound is a compound that can be crosslinked by irradiation with UV rays, an electron beam, or another such energy rays. This compound can be an oligomer that contains at least one photopolymerizable double bond in its molecule, and that has a weight average molecular weight (Mw) of 100 to 30,000, and preferably 300 to 10,000.

Specific examples of photopolymerizable low-molecular weight compounds include urethane modified acrylates, epoxy modified acrylates, polyester acrylates, and polyether acrylates; and oligomers having a hydroxyl group, carboxyl group, or other functional group, such as a (meth)acrylic acid oligomer or itaconic acid oligomer. Of these, it is preferable to use an epoxy modified acrylate or urethane modified acrylate.

The difference between this photopolymerizable low-molecular weight compound and the above-mentioned (meth)acrylic ester copolymer or epoxy resin is that the upper limit to the weight average molecular weight of the photopolymerizable low-molecular weight compound is 30,000, whereas the weight average molecular weight of the above-mentioned (meth)acrylic ester copolymer is 30,000 or higher, and that the photopolymerizable low-molecular weight compound definitely has at least one photopolymerizable double bond in its molecule, whereas the above-mentioned (meth)acrylic ester copolymer and epoxy resin usually do not have a photopolymerizable double bond.

The above-mentioned photopolymerizable low-molecular weight compound is usually used in an amount of 10 to 1000 weight parts, and preferably 50 to 600 weight parts, per 100 weight parts of (meth)acrylic ester copolymer.

When UV rays are used to crosslink the photopolymerizable low-molecular weight compound, it is preferably for a photopolymerization initiator to be added to the composition A. Examples of photopolymerization initiators include benzophenone, acetophenone, benzoin, benzoin alkyl ether, benzyl, and benzyl methyl ketal. These photopolymerization initiators can be used singly or in combinations of different types. The use of an α-substituted acetophenone is preferable.

The above-mentioned photopolymerization initiator is usually used in an amount of 0.1 to 10 weight parts, and preferably 1 to 5 weight parts, per 100 weight parts of photopolymerizable low-molecular weight compound.

A thermal activation latent epoxy resin curing agent is a type of curing agent that does not react with an epoxy resin at room temperature, but is activated by heating at or over a certain temperature, and thereby reacts with an epoxy resin. Types of thermal activation latent epoxy resin curing agents (categorized by activation method) include those that produce active species (anions and cations) in a chemical reaction brought about by heat; those which remain stably dispersed in an epoxy resin near room temperature, but become miscible and dissolve in the epoxy resin at higher temperatures, at which point a curing reaction commences; curing agents of the type that are contained in molecular sieves, which are eluted at higher temperatures and undergo a curing reaction; and those that are encapsulated in microcapsules. These thermal activation latent epoxy resin curing agents can be used singly or in combinations of different types. Of these, it is preferable to use a dicyanamide, an imidazole compound, or a mixture of a dicyanamide and an imidazole compound.

The above-mentioned thermal activation latent epoxy resin curing agent is usually used in an amount of 0.1 to 40 weight parts, and preferably 1 to 30 weight parts, per 100 weight parts of epoxy resin.

In order to adjust the adhesive performance of the composition A, a polyisocyanate compound or other such thermosetting agent can be added in addition to the above-mentioned thermal activation latent epoxy resin curing agent. This thermosetting agent is usually used in an amount of 0.1 to 30 weight parts, and preferably 5 to 20 weight parts, per 100 weight parts of (meth)acrylic ester copolymer.

b. Polyimide-based Resin

Specific examples of polyimide-based resins include polyimide resin, polyisoimide resin, maleimide resin, bis-maleimide resin, polyamide-imide resin, polyether imide resin, and poly-imide-isoindoloquinazolinedioneimide resin. These polyimide-based resins can be used singly or in combinations of different types. Of these, it is preferable to use a polyimide resin. Polyimide resins include thermoplastic polyimide resins having no reactive functional groups, and thermosetting polyimide resins that undergo an imidization reaction upon being heated. Either of these may be used, or of mixture of both may be used.

The weight average molecular weight of the polyimide-based resin is preferably about 10,000 to 1,000,000, with about 50,000 to 100,000 being particularly preferable.

c. Epoxy-based Resin

Epoxy-based resins that can be used are the same as the epoxy resin of the above-mentioned composition A. The weight average molecular weight thereof is preferable about 100 to 100,000.

The above-mentioned resin or resin composition can further contain a leuco dye, antistatic agent, coupling agent, ion scavenger, copper inhibitor, and other such additives, or another polymer, oligomer, low-molecular weight compound, etc., or an inorganic filler or the like.

The leuco dye can be 3-[N-(p-tolylamino)-7-anilinofluoran, 4,4',4''-trisdimethylaminotriphenylmethane, or the like, and the antistatic agent can be an anionic or cationic surfactant, for example.

Examples of other polymers, oligomers, and low-molecular weight compounds include epoxy resins, amide resins, urethane resins, amic acid resins, silicone resins, acrylic resins, acrylic rubbers, and various other polymers and oligomers; and triethanolamine, α,ω-(bis-3-aminopropyl)polyethylene glycol ether, and other nitrogen-containing organic compounds.

Examples of inorganic fillers include molten silica, crystalline silica, boron nitride, and silicon nitride.

It is preferable for the insulative adhesive layer 12 to have a volume resistivity of at least $1 \times 10^8$ Ωcm as an insulation. If the insulation is less than $1 \times 10^8$ Ωcm, it will be difficult to sufficiently insulate between the leads 22 of the lead frame 20.

The modulus of elasticity of the insulative adhesive layer 12 (at 150° C.) should be no more than $1 \times 10^6$ Pa. If the modulus of elasticity is over $1 \times 10^6$ Pa, it will be difficult for the resin tie bar formed by the adhesive agent of the insulative adhesive layer 12 to be sufficiently embedded between the lead frame leads, or the resin tie bar will also be susceptible to cracking, so the tie bar may not adequately fulfill its role.

Tape Base Material 10

The tape base material 10 in this embodiment basically should be able to support the insulative adhesive layer 12, and be able to be peeled away from the insulative adhesive layer 12, and may have some rigidity if needed.

Examples of this tape base material 10 include films composed of polyethylene, polypropylene, polybutene, polybutadiene, vinyl chloride, ionomers, ethylene-methacrylic acid copolymers, polyethylene terephthalate, polyethylene naphthalate, polybutylene terephthalate, polyimide, polyether imide, polyaramid, polyether ketone, polyether ether ketone, polyphenylene sulfide, poly(4-methylpentene-1), polytetrafluoroethylene, and other such resins, as well as crosslinked versions of these resins. These films can be used singly, or different types of film can be laminated. The film is usually about 5 to 300 $\mu$m thick, with 20 to 100 $\mu$m being preferable.

In addition to the above films, it is also possible to use glassine paper, clay coated paper, resin coated paper, laminated paper (such as polyethylene laminated paper or polypropylene laminated paper), and other such paper, or a nonwoven fabric, metal foil, or the like.

The surface tension of the tape base material 10 on the side on which the insulative adhesive layer 12 is formed is preferably no more than 40 dyn/cm. The side of the tape base material 10 on which the insulative adhesive layer 12 is formed can be subjected to a release treatment in order to adjust the surface tension to the desired value. A release agent based on an alkyd resin, silicone resin, fluororesin, unsaturated polyester resin, polyolefin resin, wax, or the like can be used for this release treatment. If the tape base material 10 itself has the above surface tension, then it can be used just as it is, without any release treatment being performed.

There are no particular restrictions on the method for producing the resin tie bar forming tape 1. The method may involve, for example, forming the insulative adhesive layer 12 over a sheet-form tape base material 10, and then punching out the desired shape, or forming the insulative adhesive layer 12 on a tape base material 10 that has already been formed in the desired shape, or forming the insulative adhesive layer 12 in the desired shape on a sheet-form tape base material 10.

The insulative adhesive layer 12 can be formed by coating the tape base material 10 with the above-mentioned adhesive agent by screen printing, roll printing, knife coater, microdie, dispenser, or another such method.

A solvent in which the various components of the adhesive agent can be uniformly dissolved or dispersed can be used in the preparation and application of the adhesive agent. There are no particular restrictions on this solvent as long as the components can be uniformly dissolved or dispersed therein. Examples of the solvent include dimethylformamide, dimethylacetamide, N-methylpyrrolidone, dimethyl sulfoxide, diethylene glycol dimethyl ether, toluene, benzene, xylene, methyl ethyl ketone, tetrahydrofuran, ethyl cellosolve, dioxane, cyclopentanone, cyclohexanone, monoglyme and the like. These solvents can be used singly or as a mixture of different types.

Resin Tie Bar-equipped Lead Frame 2

As shown in FIG. 2, the resin tie bar-equipped lead frame 2 pertaining to this embodiment comprises the resin tie bar forming tape 1 applied to the lead frame 20.

The lead frame 20 in this embodiment is intended for use in a QFP, and comprises an island 21 for mounting a semiconductor chip, and numerous leads 22 provided radially around the island 21. The leads 22 consist of inner leads 221 which should be located inside the package of a semiconductor device, and outer leads 222 which should be located outside the package of the semiconductor device, with gaps 23 in between the leads 22.

The resin tie bar forming tape 1 is applied to the boundary area between the inner leads 221 and outer leads 222 in the lead frame 20.

The adhesiveness of the insulative adhesive layer 12 in the resin tie bar forming tape 1 should be used to apply the resin tie bar forming tape 1 to the lead frame 20, and there are no particular restrictions on the method of application.

Here, if the insulative adhesive layer 12 of the resin tie bar forming tape 1 is tacky, the above-mentioned application can be accomplished by using the adhesive strength of this tack. If the insulative adhesive layer 12 of the resin tie bar forming tape 1 has no tack, then application should be performed by hot pressing the insulative adhesive layer 12 and the lead frame 20 together. The heating temperature in this hot pressing is preferably 30 to 300° C., with about 50 to 200° C. being particularly favorable, the heating time is preferably 0.5 second to 1 minute, with about 0.5 to 30 seconds being particularly favorable, and the pressure is preferably about 10 to 3000 N/mm$^2$.

Tacking the resin tie bar forming tape 1 to the lead frame 20 in this manner allows the resin tie bar forming tape 1 to be accurately positioned with respect to the lead frame 20. Also, if the adhesive strength of the insulative adhesive layer 12 of the resin tie bar forming tape 1 is properly adjusted at this tacking stage, it will be possible to reposition the resin tie bar forming tape 1 if it should be tacked in the wrong position.

Producing Semiconductor Device

To produce a semiconductor device (resin-molded type, QFP) using the above-mentioned resin tie bar-equipped lead frame 2, a semiconductor chip is mounted on the island 21 of the lead frame 20, the semiconductor chip is wire bonded to the inner leads 221 of the lead frame 20, and then resin molding is performed.

The tape base material 10 of the resin tie bar forming tape 1 is peeled off from the insulative adhesive layer 12 before the resin molding is performed. When the above-mentioned composition A is used for the insulative adhesive layer 12, it is preferable to use a tape base material 10 that transmits an energy rays, and irradiate the insulative adhesive layer 12 with energy rays from the tape base material 10 side before the tape base material 10 is peeled off. UV rays with a central wavelength of approximately 365 nm, an electron beam, or the like can be used as this energy rays.

When UV rays are used as the energy rays, the illuminance is usually set to between 20 and 500 mW/cm$^2$, and the irradiation time to between 0.1 and 150 seconds. When an electron beam is used, for instance, the conditions can be set the same as for UV rays. Supplemental heating can also be performed in this irradiation with, an energy rays.

This irradiation usually increases the adhesive strength between the lead frame 20 and the insulative adhesive layer 12 to between 50 and 4000 g/25 mm, and preferably 100 and 3000 g/25 mm, whereas it usually decreases the adhesive strength between the insulative adhesive layer 12 and the tape base material 10 to between 1 and 500 g/25 mm, and preferably no more than 100 g/25 mm, so the tape base material 10 can be easily peeled away from the insulative adhesive layer 12, while the insulative adhesive layer 12 can still be bonded to the lead frame 20 side.

FIG. 3a illustrates the state when the tape base material 10 of the resin tie bar forming tape 1 has been peeled away from the insulative adhesive layer 12. As shown in FIG. 3a, the insulative adhesive layer 12 is applied to the surface of the leads 22 on the lead frame 20.

In the resin molding step, first, the lead frame 20 is clamped between an upper mold 31 and a lower mold 32 of a heated mold 3. At this point, because the insulative adhesive layer 12 is applied at the boundary between the inner leads 221 and the outer leads 222 on the lead frame 20, the upper mold 31 of the mold 3 comes into contact with the insulative adhesive layer 12, and the insulative adhesive layer 12 is heated and softened by the heat from the mold 3. When the upper mold 31 of the mold 3 then presses the insulative adhesive layer 12 against the leads 22, as shown in FIG. 3b, the softened adhesive agent of the insulative adhesive layer 12 is pushed into the gaps 23 between the leads 22, and the lower ends of this adhesive agent are supported by the lower mold 32 of the mold 3. A resin tie bar is formed by the adhesive agent of the insulative adhesive layer 12, thus embedded in the gaps 23 between the leads 22.

The heating temperature of the mold 3 will vary with the type of molding resin, the type of adhesive agent in the insulative adhesive layer 12, and other factors, but is usually 100 to 300° C., and preferably 150 to 250° C. Heating the mold 3 in this manner causes the adhesive agent of the insulative adhesive layer 12 to be more efficiently embedded in the gaps 23 between the leads 22, and also cures this adhesive agent to form a good resin tie bar.

In this state, when the heated and softened molding resin is injected into the cavity of the mold 3, the molding resin fills the cavity and forms a package. Because the resin tie bar is formed by the insulative adhesive agent in the gaps 23 between the leads 22 of the lead frame 20, there is no leakage of the molding resin from these gaps 23.

With a semiconductor device obtained as above, there is no need to cut off the tie bar in order to insulate the leads 22 from each other.

Second Embodiment

Figure 4:
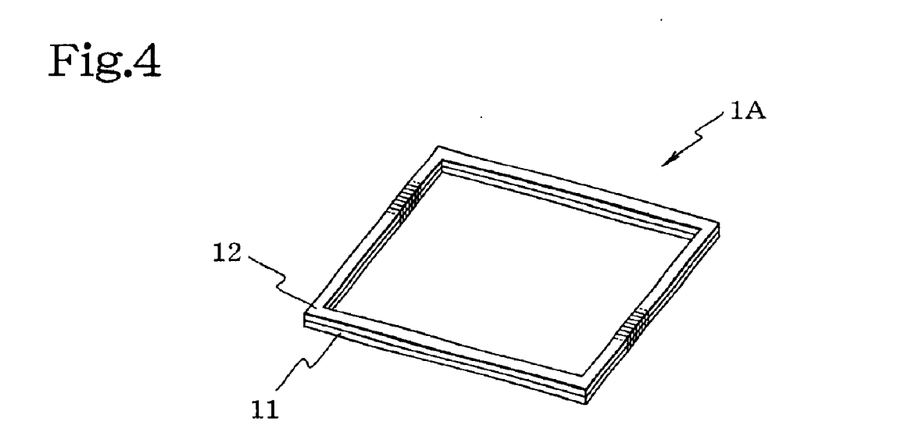
FIG. 4 is a perspective view of the resin tie bar pertaining to another embodiment of the present invention.
Figure 5:
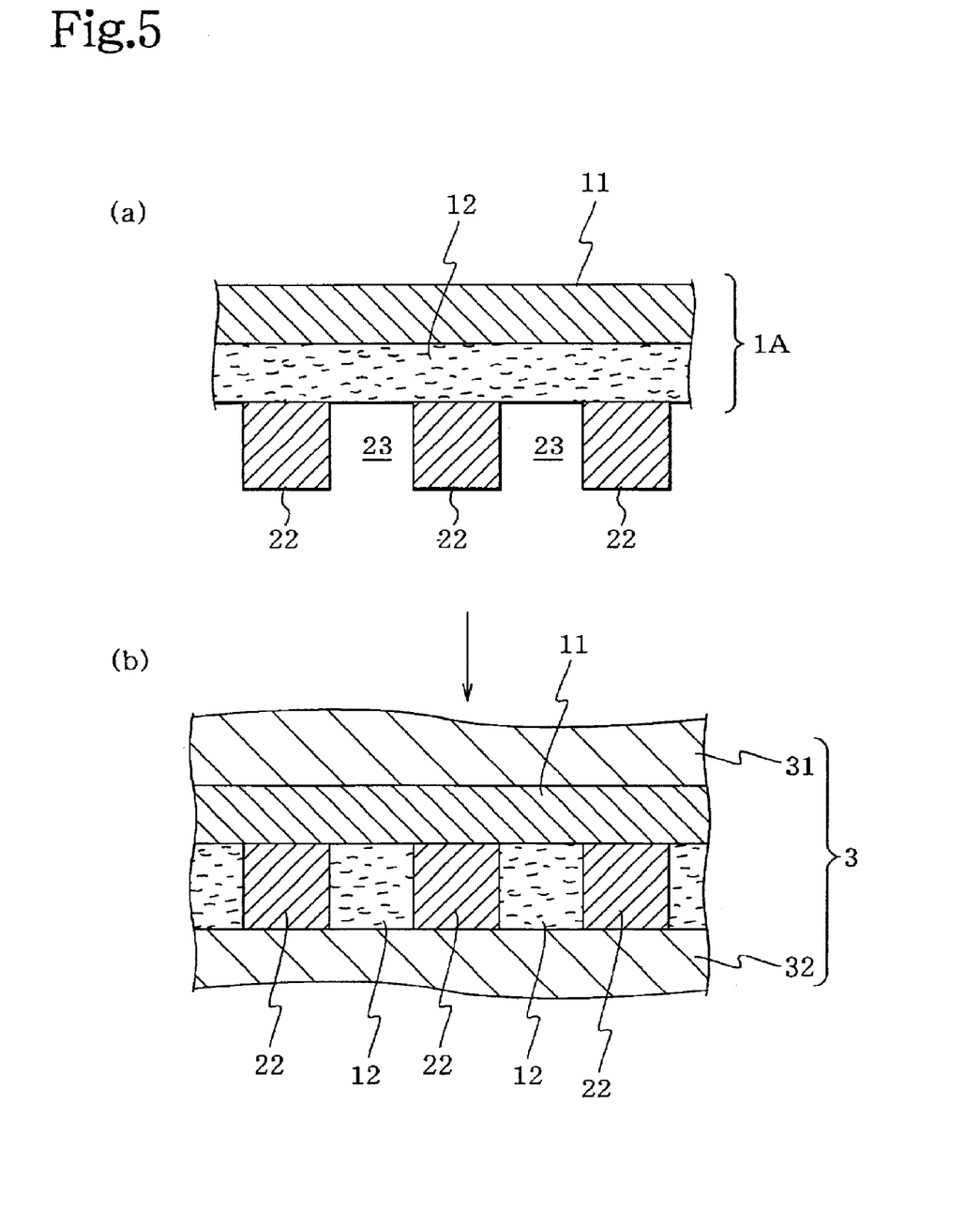
FIGS. 5(a) and 5(b) are schematic sectional views illustrating how the resin tie bar (insulative adhesive agent) pertaining to the same embodiment is embedded between the leads of a lead frame.

The resin tie bar pertaining to a second embodiment of the present invention will now be described. FIG. 4 is a perspective view of the resin tie bar pertaining to the second embodiment of the present invention, and FIG. 5 is a schematic sectional view how the resin tie bar (insulative adhesive agent) pertaining to this embodiment is embedded between the leads of a lead frame.

Resin Tie Bar 1A

As shown in FIG. 4, the resin tie bar 1A pertaining to the second embodiment of the present invention comprises a base material 11 and a insulative adhesive layer 12 formed over the base material 11. This resin tie bar 1A is square in plan view shape so as to correspond to the shape of a lead frame 20 (discussed below).

The adhesive agent used in the insulative adhesive layer 12 should be insulative and be able to be embedded between the leads of the lead frame when softened, melted, etc. It is preferable to use the same adhesive agent as the one used in the insulative adhesive layer 12 of the resin tie bar forming tape 1 in the first embodiment given above.

The thickness of the insulative adhesive layer 12 will vary with the thickness of the lead frame 20 (lead portion) in question, and with the gap between the leads 22, but is usually about 10 to 300 $\mu$m.

Base Material 11

The base material 11 in this embodiment is subjected to resin molding, without being peeled away from the insulative adhesive layer 12 of the resin tie bar 1A, and is therefore composed of a heat-resistant resin whose melting point is higher than the temperature during resin molding. The melting point of this heat-resistant resin is preferably at least 260° C.

Examples of this base material 11 include films composed of polyethylene terephthalate, polyimide, polyether imide, polyaramid, polyether ketone, polyether ether ketone, polyphenylene sulfide, poly(4-methylpentene-1), and other such resins. These films can be used singly, or different types of film can be laminated. The film is usually about 5 to 300 $\mu$m thick, with 20 to 100 $\mu$m being preferable.

Because it is possible that resin molding will be performed while the base material 11 in this embodiment contacts with the lead surface of the lead frame, it is preferable for the base material 11 to be insulative. It is preferable for the base material 11 to have a volume resistivity of at least $1 \times 10^8$ $\Omega$cm as an insulation.

Because it assumed that the base material 11 will not be peeled away from the insulative adhesive layer 12 of the resin tie bar 1A, there are no particular restrictions on the surface tension of the base material 11 as long as the insulative adhesive layer 12 can be formed.

There are no particular restrictions on the method for producing the resin tie bar 1A, and examples of producing methods are the same as those given for the resin tie bar forming tape 1 in the first embodiment above.

When the above-mentioned composition A is used for the insulative adhesive layer 12, it is preferable to irradiate the insulative adhesive layer 12 with energy rays after producing the resin tie bar 1A. The insulative adhesive layer 12 can be directly irradiated with the energy rays, but the irradiation can also be from the base material 11 side, as long as the base material 11 is able to transmit an energy rays. The type of energy rays and the irradiation conditions are the same as with the resin tie bar forming tape 1 in the first embodiment above. This irradiation reduces the tack of the insulative adhesive layer 12 of the resin tie bar 1A, and facilitates handling of the resin tie bar 1A during transport and so forth.

Resin Tie Bar-equipped Lead Frame

When the adhesive agent in the insulative adhesive layer 12 of the resin tie bar 1A is the same as the adhesive agent of the insulative adhesive layer 12 of the resin tie bar forming tape 1 in the first embodiment, the resin tie bar 1A can be applied to the lead frame 20.

The resin tie bar-equipped lead frame 2 in which the resin tie bar 1A pertaining to this embodiment has been applied to the lead frame 20 is as shown in FIG. 2. The makeup of and method of applying the resin tie bar-equipped lead frame 2 are the same as for the resin tie bar-equipped lead frame 2 in the first embodiment.

Tacking the resin tie bar 1A to the lead frame 20 in this manner allows the resin tie bar 1A to be accurately positioned with respect to the lead frame 20. Also, if the adhesive strength of the insulative adhesive layer 12 of the resin tie bar 1A is properly adjusted at this tacking stage, it will be possible to reposition the resin tie bar forming tape 1 if it should be tacked in the wrong position.

Producing Semiconductor Device

To produce a semiconductor device (resin-molded type, QFP) using the above-mentioned resin tie bar-equipped lead frame 2, a semiconductor chip is mounted on the island 21 of the lead frame 20, the semiconductor chip is wire bonded to the inner leads 221 of the lead frame 20, and then resin molding is performed.

Because the base material 11 of the resin tie bar 1A is not peeled away from the insulative adhesive layer 12, there is no need for a base material peeling step, which simplifies the semiconductor device producing process.

FIG. 5a illustrates a state in which the resin tie bar 1A has been applied to the lead frame 20. As shown in FIG. 5a, the resin tie bar 1A has been applied to the surface of the leads 22 of the lead frame 20 by means of the insulative adhesive layer 12, and the base material 11 is on the top side of the insulative adhesive layer 12.

In the resin molding step, first, the lead frame 20 is clamped between the upper mold 31 and the lower mold 32 of the heated mold 3. At this point, because the resin tie bar 1A is applied at the boundary between the inner leads 221 and the outer leads 222 on the lead frame 20, the upper mold 31 of the mold 3 comes into contact with the base material 11 of the resin tie bar 1A, and the insulative adhesive layer 12 located on the bottom side of the base material 11 is softened by the heat from the mold 3. When the upper mold 31 of the mold 3 then presses the resin tie bar 1A against the leads 22, as shown in FIG. 5b, the softened adhesive agent of the insulative adhesive layer 12 is pushed into the gaps 23 between the leads 22, and the lower ends of this adhesive agent are supported by the lower mold 32 of the mold 3. The base material 11 here is made from a heat-resistant resin whose melting point is higher than the temperature during resin molding, so there will be no heat deformation, and the normal shape (film shape) can be more or less preserved.

The heating temperature of the mold 3 is the same as the heating temperature of the mold 3 in the first embodiment above.

In this state, when the heated and softened molding resin is injected into the cavity of the mold 3, the molding resin fills the cavity and forms a package. Because the adhesive agent of the insulative adhesive layer 12 is embedded in the gaps 23 between the leads 22 of the lead frame 20, there is no leakage of the molding resin from these gaps 23. Also, since there is no heat deformation of the base material 11, any leakage of molding resin that would otherwise be caused by the heat deformation of the base material 11 is prevented.

In a semiconductor device obtained as above, the base material 11 of the resin tie bar 1A is interposed between the molding resin and the leads 22 of the lead frame 20, and the insulative adhesive agent of the insulative adhesive layer 12 of the resin tie bar 1A is embedded in the gaps 23 of the leads 22 of the lead frame 20, so there is no need to cut off the tie bar in order to insulate the leads 22 from each other.

The embodiments described above were given in an attempt to facilitate an understanding of the present invention, and are not intended to limit the scope of the present invention. Therefore, the various elements disclosed in the above embodiments also encompass all design modifications and equivalents within the technological scope of the present invention.

Figure 6:
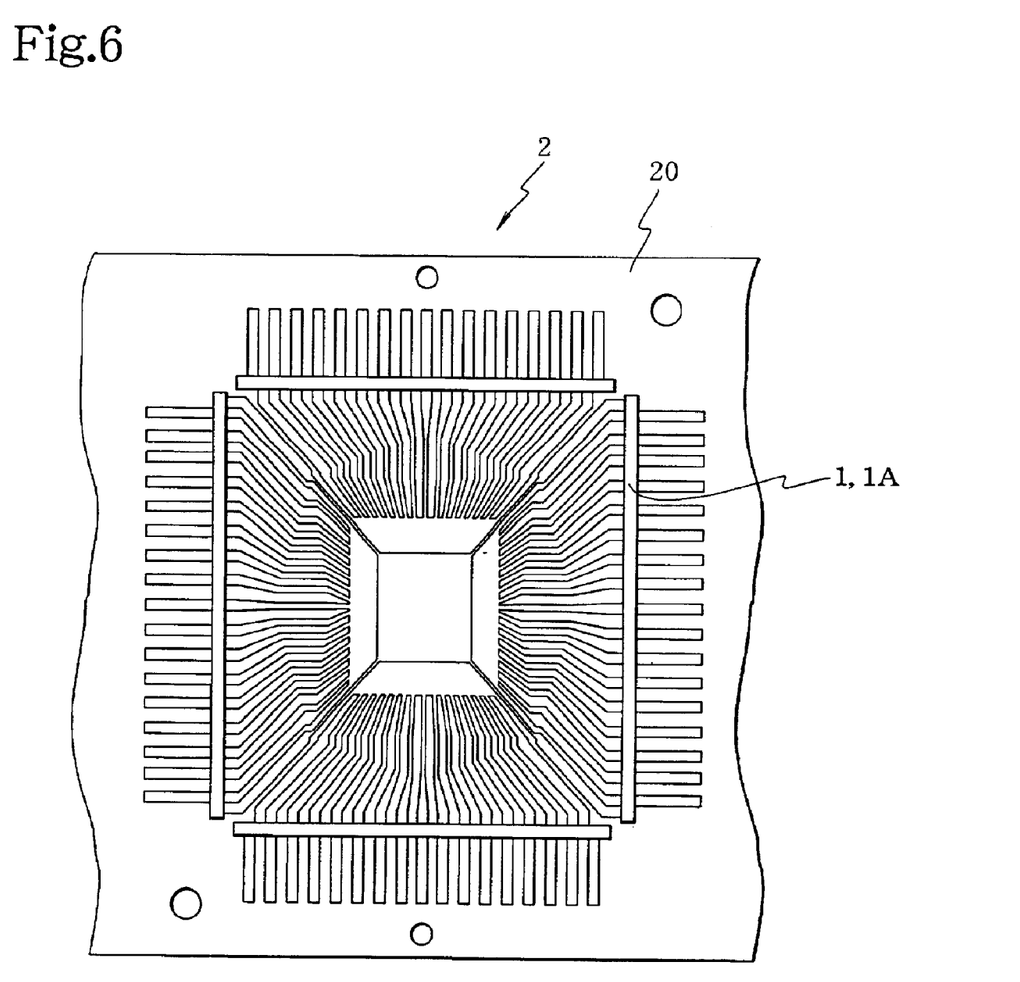
FIG. 6 is a plan view of a lead frame equipped with a resin tie bar pertaining to another embodiment of the present invention.

For instance, the shape of the resin tie bar forming tape 1 pertaining to the first embodiment and of the resin tie bar 1A pertaining to the second embodiment was square in plan view as shown in FIG. 2, but may instead be rod-shaped as shown in FIG. 6.

The first resin tie bar of the present invention (2) is easy to position accurately with respect to the lead frame, and the second resin tie bar of the present invention (3) can be easily formed into a shape that is favorable for the leads of the lead frame. When resin molding is performed using a resin tie bar such as these, the leakage of molding resin is effectively prevented. Also, there is no need to cut off the tie bar in a semiconductor device obtained using this resin tie bar.

EXAMPLES

The present invention will now be described in more specific terms through examples, etc., but the scope of the present invention is not limited to or by these examples, etc.

Example 1

Usage Example of Resin Tie Bar Forming Tape
(Adhesive Agent: Composition A)

A copolymer with a weight average molecular weight of 900,000 was prepared by copolymerizing 55 weight parts of butyl acrylate, 10 weight parts of methyl methacrylate, 20 weight parts of glycidyl methacrylate, and 15 weight parts of 2-hydroxyethyl acrylate.

Composition A was obtained by mixing 10 weight parts of the above-mentioned copolymer, 24 weight parts of liquid bisphenol A type epoxy resin (Epikote 828 manufactured by Yuka Shell Epoxy Co.,Ltd.), 10 weight parts of o-cresol novolac type epoxy resin (EOCN-104S manufactured by NIPPON KAYAKU Co.,Ltd.), 0.05 weight part of γ-glycidoxypropyltrimethoxysilane (used as a coupling agent), 1.5 weight parts of dicyandiamide (used as a thermal activation latent curing agent), 1.5 weight parts of 2-phenyl-4,5-hydroxymethylimidazole, 5 weight parts of urethane acrylate-based oligomer (used as a photopolymerizable low-molecular weight compound; Seikabeam 14-29B manufactured by Dainichiseika Color & Chemicals Mfg.Co.,Ltd.), 0.2 weight part of 1-hydroxycyclohexyl phenyl ketone (used as a photopolymerization initiator), and 1 weight part of aromatic polyisocyanate (used as a crosslinking agent; Coronate L manufactured by Nippon Polyurethane Industry Co., Ltd.).

A film (thickness: 38 $\mu$m, surface tension: 34 dyn/cm, melting point: 260° C.) of polyethylene terephthalate (PET), one side of which had been subjected to a release treatment with a silicone resin, was used as a tape base material, the release-treated side of this tape base material was coated with the above-mentioned composition A by knife coater in a thickness (solids coating thickness) of 50 $\mu$m, and this coating was dried for 2 minutes at 100° C. The tape base material on which an insulative adhesive layer composed of composition A had thus been formed was punched out in the shape of a QFP lead frame, so as to be square in shape in plan view, with a width of 1.5 mm. This product was used as a resin tie bar forming tape.

The volume resistivity as an insulation of the above-mentioned composition A was $2 \times 10^{15}$ Ωcm, and the modulus of elasticity (at 150° C.) was $9 \times 10^3$ Pa.

The above-mentioned resin tie bar forming tape was applied to a lead frame (copper-based, 125 $\mu$m thick, outer lead pitch of 400 $\mu$m, outer lead width of 200 $\mu$m, outer lead gap of 200 $\mu$m; the same applies hereinafter) under hot press-bonding conditions of 1 second at 190° C. and 150 N/mm$^2$. After this, the resin tie bar forming tape was irradiated with UV rays (using an Adwill RAD-2000 m/8 manufactured by Lintec Corporation; irradiation conditions: 6 seconds of irradiation at an illuminance of 340 mW/cm$^2$), and the PET film (tape base material) was peeled off.

A semiconductor chip was mounted on the island of the resulting resin tie bar-equipped lead frame, and the semiconductor chip was wire bonded to the inner leads of the lead frame, after which this resin tie bar-equipped lead frame was placed in a mold heated to 180° C., and resin molding was performed for 4 hours at 180° C. An epoxy resin (CEL-9200 manufactured by Hitachi Chemical Co.,Ltd.) was used as the molding resin.

Because the adhesive agent of the above-mentioned insulative adhesive layer was embedded between the leads of the lead frame, forming a good resin tie bar, there was no leakage of molding resin.

Example 2

Usage Example of Resin Tie Bar Forming Tape (Adhesive Agent: Polyimide-based Resin)

A resin tie bar forming tape was produced in the same manner as in Example 1, except that a tetrahydrofuran/monoglyme solution (solids content: 20 wt %) of a thermoplastic polyimide (Upitite UPA-N221 manufactured by Ube Industries Ltd.) was used instead of the composition A used in Example 1, a polyethylene naphthalate (PEN) film (thickness: 38 µm, surface tension: 34 dyn/cm, melting point: 272° C., insulation: $2\times10^{17}$ Ωcm) that had undergone a release treatment with a silicone resin on one side was used instead of the PET film in Example 1 that had been release treated on one side with a silicone resin, and the thermoplastic polyimide drying conditions were changed to 3 minutes at 140° C.

The volume resistivity as an insulation of the insulative adhesive layer composed of the above-mentioned thermoplastic polyimide was $2\times10^{16}$ Ωcm and the modulus of elasticity (at 150° C.) was $5\times10^{5}$ Pa.

The above resin tie bar forming tape was applied to a lead frame under hot press-bonding conditions of 1 second at 190° C. and 150 N/mm$^2$, after which the PEN film (tape base material) was peeled off.

Resin molding was performed in the same manner as in Example 1 using the resin tie bar-equipped lead frame thus obtained. As a result, because the adhesive agent of the insulative adhesive layer was embedded between the leads of the lead frame, forming a good resin tie bar, there was no leakage of molding resin.

Example 3

Usage Example of Resin Tie Bar Forming Tape (Adhesive Agent: Epoxy-based Resin Composition)

An epoxy-based resin adhesive agent was produced by mixing 40 weight parts of a bisphenol type epoxy resin with a high molecular weight (Epikote 1010 manufactured by Yuka Shell Epoxy Co.,Ltd.), 20 weight parts of polyfunctional cresol novolac type epoxy resin (EOCN-4600 manufactured by NIPPON KAYAKU Co.,Ltd.), and 1.5 weight parts of 2-phenyl-4,5-hydroxymethylimidazole and 0.1 weight part of γ-glycidoxypropyltrimethoxysilane (used as thermal activation latent curing agents).

A resin tie bar forming tape was produced in the same manner as in Example 1, except that the above-mentioned epoxy-based resin adhesive agent was used instead of the composition A used in Example 1.

The volume resistivity as an insulation of the insulative adhesive layer composed of the above-mentioned epoxy-based resin adhesive agent was $2\times10^{15}$ Ωcm and the modulus of elasticity (at 150° C.) was $5\times10^{2}$ Pa.

The above resin tie bar forming tape was applied to a lead frame under hot press-bonding conditions of 1 second at 190° C. and 150 N/mm$^2$, after which the PET film (tape base material) was peeled off.

Resin molding was performed in the same manner as in Example 1 using the resin tie bar-equipped lead frame thus obtained. As a result, because the adhesive agent of the insulative adhesive layer was embedded between the leads of the lead frame, forming a good resin tie bar, there was no leakage of molding resin.

Example 4

Usage Example of Resin Tie Bar (Adhesive Agent: Composition A)

A resin tie bar was produced in the same manner as in Example 1, except that a PEN film (thickness: 38 µm, melting point: 272° C., insulation: $2\times10^{17}$ Ωcm) that had not undergone a release treatment was used instead of the PET film in Example 1 that had been release treated on one side with a silicone resin.

The insulative adhesive layer of the resin tie bar thus obtained was irradiated with UV rays (using an Adwill RAD-2000 m/8 manufactured by Lintec Corporation; irradiation conditions: 6 seconds of irradiation at an illuminance of 340 mW/cm$^2$) which removed the tack on the surface of the insulative adhesive layer.

The above resin tie bar was applied to a lead frame under hot press-bonding conditions of 1 second at 190° C. and 150 N/mm$^2$. Resin molding was performed in the same manner as in Example 1 using the resin tie bar-equipped lead frame thus obtained.

As a result, because the adhesive agent of the insulative adhesive layer was embedded between the leads of the lead frame, forming a good resin tie bar, and because the PEN film used as the base material did not undergo heat deformation, there was no leakage of molding resin.

Example 5

Usage Example of Resin Tie Bar (Adhesive Agent: Polyimide-based Resin)

A resin tie bar was produced in the same manner as in Example 2, except that the PEN film in Example 4 that had not undergone a release treatment was used instead of the PEN film in Example 2 that had been release treated on one side with a silicone resin.

The above resin tie bar was applied to a lead frame under hot press-bonding conditions of 1 second at 190° C. and 150 N/mm$^2$. Resin molding was performed in the same manner as in Example 1 using the resin tie bar-equipped lead frame thus obtained.

As a result, because the adhesive agent of the insulative adhesive layer was embedded between the leads of the lead frame, forming a good resin tie bar, and because the PEN film used as the base material did not undergo heat deformation, there was no leakage of molding resin.

Example 6

Usage Example of Resin Tie Bar (Adhesive Agent: Epoxy-based Resin Composition)

A resin tie bar was produced in the same manner as in Example 3, except that the PEN film in Example 4 that had not undergone a release treatment was used instead of the PET film in Example 3 that had been release treated on one side with a silicone resin.

The above resin tie bar was applied to a lead frame under hot press-bonding conditions of 1 second at 190° C. and 150 N/mm². Resin molding was performed in the same manner as in Example 1 using the resin tie bar-equipped lead frame thus obtained.

As a result, the adhesive agent of the insulative adhesive layer was embedded between the leads of the lead frame, forming a good resin tie bar, and because the PEN film used as the base material did not undergo heat deformation, there was no leakage of molding resin.

Comparative Example 1

Usage Example of Resin Tie Bar (Adhesive Agent: Composition A)

A resin tie bar was produced in the same manner as in Example 1, and was applied to a lead frame under hot press-bonding conditions of 1 second at 190° C. and 150 N/mm². Resin molding was performed in the same manner as in Example 1 using the resin tie bar-equipped lead frame thus obtained.

As a result, the adhesive agent of the insulative adhesive layer was embedded between the leads of the lead frame, forming a good resin tie bar, but because the PET film serving as the base material underwent heat deformation, the molding resin leaked from this deformed portion.

Comparative Example 2

Usage Example of Resin Tie Bar (Adhesive Agent: Thermosetting Polyimide)

A resin tie bar was produced in the same manner as in Example 2, except that an N-methylpyrrolidone/ethyl cellosolve solution of a thermosetting polyimide (Semicofine SP-110 manufactured by Toray Industries, Inc.) was used instead of the tetrahydrofuran/monoglyme solution of a thermoplastic polyimide used in Example 2, and this thermosetting polyimide was dried for 3 minutes at 140° C., cured first for 30 minutes at 150° C. and then for 30 minutes at 200° C.

The volume resistivity as an insulation of the insulative adhesive layer composed of the above-mentioned thermosetting polyimide was $1 \times 10^{16}$ Ωcm and the modulus of elasticity (at 150° C.) was $2 \times 10^{10}$ Pa.

This resin tie bar was mounted on a lead frame, and molding resin was performed in the same manner as in Example 1. As a result, the resin tie bar was slightly misaligned with respect to the lead frame, and the adhesive agent of the insulative adhesive layer was not adequately embedded between the leads of the lead frame, so there was leakage of the molding resin.

What is claimed is:

1. A tape for forming a resin tie bar, comprising:
   a removable tape base material that has a surface tension of not more than 40 dyn/cm; and
   an insulative adhesive layer comprising an insulative adhesive agent and formed on the tape base material, the insulative adhesive layer having a modulus of elasticity of not more than $1 \times 10^6$ Pa at 150° C.,
   wherein the insulative adhesive agent exhibits stepped adhesion and is formed from a composition that contains a (meth)acrylic ester copolymer with a weight average molecular weight of at least 30,000, an epoxy resin with a weight average molecular weight of 100 to 10,000, a photopolymerizable low-molecular weight compound, and a thermal activation latent epoxy resin curing agent.

2. A resin tie bar comprising an insulative adhesive agent that exhibits stepped adhesion and that has a modulus of elasticity of not more than $1 \times 10^6$ Pa at 150° C., wherein the adhesive agent is formed from a composition that contains a (meth)acrylic ester copolymer with a weight average molecular weight of at least 30,000, an epoxy resin with a weight average molecular weight of 100 to 10,000, a photopolymerizable low-molecular weight compound, and a thermal activation latent epoxy resin curing agent.

3. A resin tie bar, comprising:
   a base material made from a heat-resistant resin that is not thermally deformable during resin molding; and
   an insulative adhesive layer composed of an insulative adhesive agent and formed on the tape base material, the insulative adhesive layer having a modulus of elasticity of not more than $1 \times 10^6$ Pa at 150° C.,
   wherein the adhesive agent is formed from a composition that contains a (meth)acrylic ester copolymer with a weight-average molecular weight of not less than 30,000, an epoxy resin having a weight-average molecular weight of 100 to 10,000, a photopolymerizable low-molecular weight compound, and a thermal activation latent epoxy resin curing agent.

4. The resin tie bar according to claim 3, wherein the insulative adhesive agent exhibits stepped adhesion.

5. A lead frame equipped with a resin tie bar, wherein the resin tie bar according to any of claims 2 to 4 is applied to a surface of leads of the lead frame.

6. A resin-molded semiconductor device, wherein the insulative adhesive agent of the resin tie bar according to claim 2 is embedded between the leads of the lead frame.

7. A resin-molded semiconductor device, wherein the insulative adhesive agent of the resin tie bar according to claim 3 or 4 is embedded between leads of a lead frame, and the base material of the resin tie bar is interposed between the molding resin and the leads of the lead frame.

8. A method for producing a resin-molded semiconductor device, comprising the steps of:
   applying the resin tie bar according to any of claims 2 to 4 to a surface of leads of a lead frame; and
   when resin molding is performed, pressing the resin tie bar with a heated mold to soften the insulative adhesive agent of the resin tie bar and push it in between the leads of the lead frame.

9. A resin-molded semiconductor device produced by the method according to claim 8.

* * * * *